United States Patent
Ohashi et al.

(10) Patent No.: US 7,351,645 B2
(45) Date of Patent: Apr. 1, 2008

(54) PRESSURE SENSITIVE ADHESIVE SHEET FOR USE IN SEMICONDUCTOR WORKING AND METHOD FOR PRODUCING SEMICONDUCTOR CHIP

(75) Inventors: Hitoshi Ohashi, Saitama (JP); Tatsuya Izumi, Saitama (JP); Kazuhiro Takahashi, Kawaguchi (JP)

(73) Assignee: Lintec Corporation, Tokyo (JP)

( * ) Notice: Subject to any disclaimer, the term of this patent is extended or adjusted under 35 U.S.C. 154(b) by 246 days.

(21) Appl. No.: 11/140,763

(22) Filed: May 31, 2005

(65) Prior Publication Data

US 2005/0269717 A1 Dec. 8, 2005

(30) Foreign Application Priority Data

Jun. 2, 2004 (JP) ............... 2004-164704

(51) Int. Cl.
*H01L 21/301* (2006.01)
(52) U.S. Cl. ..................................... 438/465
(58) Field of Classification Search ............... 257/620; 438/113, 465
See application file for complete search history.

(56) References Cited

U.S. PATENT DOCUMENTS

| | | | |
|---|---|---|---|
| 6,414,047 B1 * | 7/2002 | Abe | 521/142 |
| 6,465,330 B1 | 10/2002 | Takahashi et al. | |
| 6,541,123 B1 * | 4/2003 | Taniguchi et al. | 428/520 |
| 6,620,474 B1 * | 9/2003 | Regnier et al. | 428/35.7 |
| 6,670,087 B2 * | 12/2003 | Fujikawa et al. | 430/109.2 |
| 6,822,031 B2 * | 11/2004 | Tai et al. | 524/398 |
| 2002/0086946 A1 * | 7/2002 | Abe | 525/240 |
| 2003/0212216 A1 * | 11/2003 | Mizoguchi et al. | 525/329.7 |
| 2004/0029987 A1 * | 2/2004 | Sawai | 521/155 |
| 2004/0254328 A1 * | 12/2004 | Haraguchi et al. | 528/91 |
| 2005/0148694 A1 * | 7/2005 | Inata | 523/400 |

FOREIGN PATENT DOCUMENTS

| | | |
|---|---|---|
| EP | 0 252 739 A2 | 7/1987 |
| JP | 60-196956 A | 10/1985 |
| JP | 60-223139 A | 11/1985 |
| JP | 05-032946 A | 2/1993 |

(Continued)

*Primary Examiner*—Thao P. Le
(74) *Attorney, Agent, or Firm*—The Webb Law Firm, P.C.

(57) ABSTRACT

A pressure sensitive adhesive sheet to be used in producing an extremely thin semiconductor chip which is free of breakage and discoloration by a predicing process and a method of use thereof are provided. The pressure sensitive adhesive sheet is used in a method for producing a semiconductor chip, in which the method involves the steps of: forming a groove having depth smaller than thickness of a wafer on a surface of the wafer on which a semiconductor circuit is formed; reducing the thickness of the wafer and finally dividing the wafer into individual chips by grinding a back face of the wafer. The pressure sensitive adhesive sheet contains a rigid substrate, a vibration relaxation layer provided on one face of the rigid substrate and a pressure sensitive adhesive layer provided on the other face of the rigid substrate, in which thickness of the rigid substrate is 10 to 150 μm and Young's modulus thereof is 1000 to 30000 MPa, and thickness of the vibration relaxation layer is 5 to 80 μm and a maximum value of tan δ of dynamic viscoelasticity thereof at −5° C. to 120° C. is 0.5 or more.

6 Claims, 2 Drawing Sheets

FOREIGN PATENT DOCUMENTS

| | | |
|---|---|---|
| JP | 5-77284 B2 | 10/1993 |
| JP | 05-335411 A | 12/1993 |
| JP | 6-101455 B2 | 12/1994 |
| JP | 08-027239 A | 1/1996 |
| JP | 2001-127029 A | 5/2001 |
| JP | 3-410371 B2 | 5/2003 |
| JP | 2003-147300 A | 5/2003 |
| WO | WO 03/043076 A2 | 5/2003 |

* cited by examiner

PRESSURE SENSITIVE ADHESIVE SHEET FOR USE IN SEMICONDUCTOR WORKING AND METHOD FOR PRODUCING SEMICONDUCTOR CHIP

BACKGROUND OF THE INVENTION

The present invention relates to a pressure sensitive adhesive sheet to be used at the time of producing a thin type chip by processing a wafer on which a semiconductor circuit is formed. Further, the present invention relates to a method for producing the thin type chip by processing the wafer on which the semiconductor circuit is formed by using the pressure sensitive adhesive sheet.

In recent years, spread of IC cards has been promoted and further reduction of thickness thereof is now demanded. Accordingly, it is now required that the thickness of a semiconductor chip, which has been about 350 μm, is reduced to 50 to 100 μm or less. As a technology for attaining the reduction of chip thickness, a process for producing the semiconductor chip in which a groove of a given depth is formed from a surface side of the wafer and, thereafter, the wafer is ground from aback face side is disclosed in JP-A No. 5-335411. This process is known as a "predicing process" and can efficiently produce the thin type chip by simultaneously grinding the back face of the wafer (hereinafter, referred to also as "wafer back face grinding") and dividing the wafer into individual chips.

At the time of performing the wafer back face grinding by the predicing process, in order to protect the circuit on the surface of the wafer or to fix the wafer (chip), a specific pressure sensitive adhesive sheet is stuck onto the surface of the wafer on which the groove is formed. The present inventor has solved various types of problems generated in the course of producing the thin type chip by the predicing process by developing a unique pressure sensitive adhesive sheet.

For example, in Japanese Patent No. 3410371, the number of chip cracks to be generated at the time of performing the back face grinding is reduced by specifying compressive strain of the pressure sensitive adhesive sheet and elastic modulus of a pressure sensitive adhesive layer. In JP-A No. 2001-127029, an internal stress generated at the time of sticking the pressure sensitive adhesive sheet to the wafer is relaxed and narrowing of a chip-chip space which becomes a problem at the time of dividing a wafer into individual chips in a grinding step is prevented by using the pressure sensitive adhesive sheet which shows specified Young's modulus and stress relaxation ratio. Further, in JP-A No. 2003-147300, production of an extremely thin chip by the predicing process is allowed to be adapted to an automatic process by enhancing an adhesion property to a stripping tape by means of providing a constituent layer having a low glass transition point in a substrate of the pressure sensitive adhesive sheet.

Reduction of thickness of the wafer (chip) has been progressed in the predicing process by these inventions. As a result, a new problem has appeared. As the wafer was ground thinner, the wafer came to be more brittle. Then, a breakage was generated in a portion at any one of four corners of a produced chip due to vibration or impact transmitted from a grinding stone during a grinding operation. Further, since stress at the time of further grinding a thin wafer was not evenly applied to the thin wafer, discoloration has appeared on a thus-ground face of the wafer.

SUMMARY OF THE INVENTION

The present invention intends to solve a series of such problems as described above on conventional techniques. Namely, an object of the present invention is to provide a pressure sensitive adhesive sheet to be used for producing an extremely thin semiconductor chip which is free of breakage and discoloration by a predicing process and another object of the present invention is to provide a method for use thereof.

That is, the present invention relates, for example, to the following matters.

(1) A pressure sensitive adhesive sheet, being used in a method for producing a semiconductor chip, wherein the method comprises the steps of: forming a groove having depth smaller than thickness of a wafer on a surface of the wafer on which a semiconductor circuit is formed; reducing the thickness of the wafer and finally dividing the wafer into individual chips by grinding a back face of the wafer;

the pressure sensitive adhesive sheet, comprising a rigid substrate, a vibration relaxation layer provided on one face of the rigid substrate and a pressure sensitive adhesive layer provided on the other face of the rigid substrate, wherein thickness of the rigid substrate is 10 to 150 μm and Young's modulus thereof is 1000 to 30000 MPa; and thickness of the vibration relaxation layer is 5 to 80 μm and a maximum value of tan δ of dynamic viscoelasticity thereof at −5° C. to 120° C. is 0.5 or more.

(2) The pressure sensitive adhesive sheet described in (1), which is used for producing a semiconductor chip having a thickness of 100 μm or less.

(3) A method for producing a semiconductor chip, comprising the steps of:

forming a groove having depth smaller than thickness of a wafer on a surface of the wafer on which a semiconductor circuit is formed;

sticking a pressure sensitive adhesive sheet, comprising a rigid substrate, a vibration relaxation layer provided on one face of the rigid substrate and a pressure sensitive adhesive layer provided on the other face of the rigid substrate, wherein thickness of the rigid substrate is 10 to 150 μm and Young's modulus thereof is 1000 to 30000 MPa; and thickness of the vibration relaxation layer is 5 to 80 μm and a maximum value of tan δ of dynamic viscoelasticity thereof at −5° C. to 120° C. is 0.5 or more on to the surface on which the circuit is formed; and reducing the thickness of the wafer and finally dividing the wafer into individual chips by grinding a back face of the wafer.

(4) The method for producing the semiconductor chip described in (3), wherein the resulting semiconductor chip has a thickness of 100 μm or less.

According to the present invention, the pressure sensitive adhesive sheet to be used in producing the extremely thin semiconductor chip which is free of breakage and discoloration by the predicing process and the method of use thereof can be provided.

DETAILED DESCRIPTION OF THE INVENTION

The present invention will be described in detail below with reference to the appended drawings.

Figure 1:
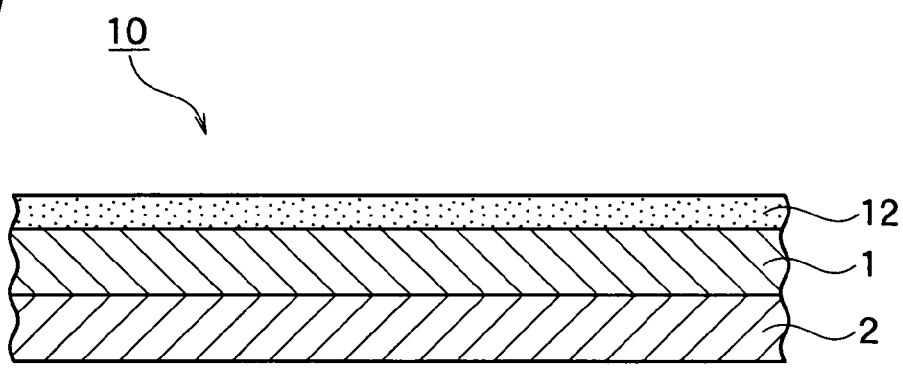
FIG. 1 shows a cross-sectional diagram of a pressure sensitive adhesive sheet according to the present invention.

As shown in FIG. 1, a pressure sensitive adhesive sheet 10 according to the present invention includes a rigid substrate 1, a vibration relaxation layer 2 which is provided on one face of the rigid substrate 1 and a pressure sensitive adhesive layer 12 which is provided on the other face of the rigid substrate 1.

Thickness of the rigid substrate 1 is in the range of 10 to 150 μm and, particularly preferably, 25 to 130 μm. Young's modulus (measured in accordance with Japanese Industrial Standard (JIS) K-7127) of the rigid substrate 1 is in the range of 1000 to 30000 MPa and, particularly preferably, 1600 to 10,000 MPa. When both the Young's modulus and the thickness of the rigid substrate 1 fall within the above ranges, respectively, not only machine adaptability at the time of sticking the pressure sensitive adhesive sheet onto the wafer becomes excellent, but also stress to be applied to the wafer (chip) at the time of peeling the pressure sensitive adhesive sheet can be reduced.

The rigid substrate 1 is not particularly limited, so long as the above-described properties are satisfied, and various types of thin layer articles can be used. From a viewpoint of, for example, water resistance, heat resistance and rigidity, it is preferred to use a synthetic resin film. As for the rigid substrate 1, specifically, anyone of synthetic resin films of polyethylene terephthalate, polyethylene naphthalate, polybutylene terephthalate, a polyamide, a polyacetal, a polycarbonate, a modified polyphenylene oxide, polyphenylene sulfide, polysulfone, all of aromatic polyesters, a polyether ketone and a polyimide, and a biaxially stretched polypropylene film is used. The rigid substrate 1 may be in the form of a monolayer film or a laminate of these films. Among the above-described films, those which do not give an adverse effect, such as an ion contamination, on the wafer are preferred as the rigid substrate 1. Specifically, films of polyethylene terephthalate, polyethylene naphthalate, polybutylene terephthalate, a polyimide and a polyamide, and a biaxially stretched polypropylene film are particularly preferred.

Thickness of the vibration relaxation layer 2 is, preferably, in the range of 5 to 80 μm and, particularly preferably, 15 to 60 μm. A maximum value of tan δ (hereinafter, referred to also as "tan δ value" for the purpose of simplicity) of the vibration relaxation layer 2 at a temperature of −5 to 120° C. is 0.5 or more. On this occasion, tan δ is denoted as a loss tangent and is defined as loss elastic modulus/storage elastic modulus. Specifically, tan δ is determined by a response to stress, such as tensile stress or twisting stress, given to an object by dynamic viscoelasticity measuring apparatus.

So long as the thickness of the vibration relaxation layer 2 and the value of tan δ are within the above-described ranges, respectively, even when a chip is ground to be 100 μm or less in thickness, since vibration or impact of a grinding stone during a back face grinding operation is absorbed by the vibration relaxation layer 2, a corner of the chip is not broken and a face thus ground is not discolored.

The vibration relaxation layer 2 is formed from a film made of a resin and is not particularly limited, so long as thickness and properties thereof are within the above-described ranges, respectively. Resins capable of satisfying the above properties, and resins containing appropriate additives so as to achieve the properties are employable. The vibration relaxation layer 2 may be a cured film of a curable resin or may be made of a film of a thermoplastic resin.

As for such curable resins, a photocurable resin, a thermosetting resin and the like are used. Preferably, the photocurable resin is used. As for the photocurable resin, for example, a resin composition having, as a main ingredient, a polyfunctional urethane acrylate type oligomer or a polyene.thiol type resin is favorably used.

Such urethane acrylate type oligomer can be obtained by, firstly, allowing a polyester or polyether type polyol compound to react with a polyisocyanate compound such as 2,4-tolylene diisocyanate, 2,6-tolylene diisocyanate, 1,3-xylylene diisocyanate, 1,4-xylylene diisocyanate or diphenylmethane-4,4'-diisocyanate to obtain an isocyanate-terminal urethane prepolymer and, then, by allowing the thus-obtained isocyanate-terminal urethane prepolymer to react with a hydroxyl group-containing acrylate or methacrylate such as 2-hydroxyethyl acrylate, 2-hydroxyethyl methacrylate, 2-hydroxypropyl acrylate, 2-hydroxypropyl methacrylate, polyethylene glycol acrylate or polyethylene glycol methacrylate. This urethane acrylate type oligomer has a photopolymerizable double bond in the molecule and undergoes polymerization and curing when irradiated with light, to thereby form a film.

A weight average molecular weight of the urethane acrylate type oligomer to be used in the present invention is preferably in the range of 1000 to 50000 and, more preferably, in the range of 2000 to 30000. Such urethane acrylate type oligomers can be used either each individually or in any combinations.

It is often difficult to form the film only by using any one of such urethane acrylate type oligomers as described above. Thus, the film is generally obtained by firstly diluting the urethane acrylate type oligomer with a photopolymerizable monomer and, secondly, forming the film and, then, curing the thus-formed film. The photopolymerizable monomer has a photopolymerizable double bond in the molecule and, in the present invention, an acrylic ester compound having a relatively bulky group is favorably used.

Examples of such photopolymerizable monomers employed for diluting the urethane acrylate type oligomer include alicyclic compounds such as isobornyl (meth)acrylate, dicyclopentenyl (meth)acrylate, dicyclopentanyl (meth)acrylate, dicyclopentenyloxy (meth)acrylate, cyclohexyl (meth)acrylate and adamantane (meth)acrylate; aromatic compounds such as benzyl acrylate; and heterocyclic compounds such as tetrahydrofurfuryl (meth)acrylate, morpholinyl acrylate, N-vinylpyrrolidone and N-vinylcaprolactam. According to necessity, a polyfunctional (meth) acrylate may be used.

The above-described photopolymerizable monomer is preferably added in an amount of 5 to 900 parts by weight, more preferably 10 to 500 parts by weight and, particularly preferably, 30 to 200 parts by weight, on the basis of 100 parts by weight of the urethane acrylate type oligomer.

On the other hand, the photopolymerizable polyene/thiol resin for use in the production of the vibration relaxation layer 2 comprises of a polyene compound having no acryloyl group and a polythiol compound. Specifically, the polyene compound is selected from among, for example, diacrolein pentaerythritol, trimethylolpropane diallyl ether adduct of tolylene diisocyanate and unsaturated allylurethane oligomer. Mercaptoacetic acid or mercaptopropionic acid ester of pentaerythritol can preferably be used as the polythiol compound. Furthermore, use can be made of commercially available polyene polythiol oligomers. A weight average molecular weight of the polyene/thiol resin for use in the present invention is preferably in the range of 3000 to 50,000, still preferably 5000 to 30,000.

In the forming of the vibration relaxation layer 2 from the photocurable resin, the time spent for photopolymerization and the photoirradiation dose can be reduced by mixing a photopolymerization initiator into the resin.

This photopolymerization initiator can be a photoinitiator such as a benzoin compound, an acetophenone compound, an acylphosphine oxide compound, a titanocene compound, a thioxanthone compound or a peroxide compound, or a photosensitizer such as an amine or a quinone. Specific examples of these compounds include 1-hydroxycyclohexyl phenyl ketone, benzoin, benzoin methyl ether, benzoin ethyl ether, benzoin isopropyl ether, benzyl diphenyl sulfide, tetramethylthiuram monosulfide, azobisisobutyronitrile, dibenzyl, diacetyl, β-chloroanthraquinone and 2-hydroxy-2-methyl-1-phenyl-propane-1-one.

The photopolymerization initiator is preferably added in an amount of 0.05 to 15 parts by weight, more preferably 0.1 to 10 parts by weight and, particularly preferably, 0.5 to 5 parts by weight, on the basis of 100 parts by weight of the resin total.

In the production of the above curable resin, an oligomer or a monomer can be selected from among various types of combinations thereof such that the above-described properties can be realized. As for the thermoplastic resin to be used in the vibration relaxation layer 2, for example, a polyolefin type resin such as polybutene, polybutadiene or polymethylpentene; or a nonhydrogenated or hydrogenated styrene-vinyl isoprene block copolymer can be used. Particularly, the nonhydrogenated or hydrogenated styrene-vinyl isoprene block copolymer is preferred.

The styrene-vinylisoprene block copolymer is generally a high vinyl bond SIS (styrene-isoprene-styrene block copolymer). Each of the nonhydrogenated and hydrogenated styrene-vinyl isoprene block copolymers per se exhibits a high peak of tan δ at about room temperature.

Additives capable of enhancing the tan δ value are preferably added to the above-described resin. Examples of the additives capable of enhancing the tan δ value include inorganic fillers such as calcium carbonate, silica and mica; and metal fillers such as iron and lead. Particularly, addition of the metal fillers each having a high specific gravity is effective.

The rigid substrate 1 and the vibration relaxation layer 2 are bonded to each other by using an adhesive, to thereby form a laminate; or a laminate is formed by, firstly, coating a resin for forming the vibration relaxation layer 2 on the rigid substrate 1 and, then, allowing the resin to form a film, to thereby form a laminate.

When the rigid substrate 1 and the vibration relaxation layer 2 are bonded to each other by using the adhesive, a general-purpose adhesive for dry laminate may be used or the pressure sensitive adhesive may be used. When the laminate is formed by coating of the resin, the resin for forming the vibration relaxation layer 2 may be in the form of a solution or a dispersion, or may be extruded by an extruder in a melting state.

A total thickness of the rigid substrate 1 and the vibration relaxation layer 2 is preferably 15 to 230 μm and, particularly preferably, 40 to 190 μm. The surface of the rigid substrate 1 on which the pressure sensitive adhesive layer 12 is to be formed may be subjected to a corona treatment or provided with another layer such as a primer, in order to enhance the adhesion property to the pressure sensitive adhesive layer 12.

The pressure sensitive adhesive sheet 10 according to the present invention is produced by providing the pressure sensitive adhesive layer 12 on a surface of the laminate of the rigid substrate 1 and the vibration relaxation layer 2 at the side of the rigid substrate 1.

According to the present invention, the elastic modulus of the pressure sensitive adhesive which constitutes the pressure sensitive adhesive layer 12 at 23° C. is, preferably, in the range of $5.0 \times 10^4$ to $1.0 \times 10^8$ Pa, more preferably in the range of $6.0 \times 10^4$ to $8.0 \times 10^7$ Pa and, particularly preferably, in the range of $7.0 \times 10^4$ to $5.0 \times 10^7$ Pa. So long as the elastic modulus of the pressure sensitive adhesive is within these ranges, the wafer can surely be fixed to the pressure sensitive adhesive sheet, to thereby enhance a grinding adaptability of the wafer. On this occasion, in a case where the pressure sensitive adhesive layer 12 is formed by an energy ray curable type pressure sensitive adhesive to be described below, the elastic modulus indicates an elastic modulus prior to an energy ray curing.

So long as the pressure sensitive adhesive layer 12 preferably has the above-described elastic modulus, the pressure sensitive adhesive layer 12 is not particularly limited and can be produced by using various types of pressure sensitive adhesives which have conventionally been used in the pressure sensitive adhesive sheet for working the semiconductor. Specifically, for example, rubber, acrylic, silicone and polyvinyl ether type pressure sensitive adhesives can be used. Further, energy ray curable type, heat foaming type and water swellable type pressure sensitive adhesives can also be used.

Among such energy ray curable type (inclusive of energy ray curable type, ultraviolet ray curable type and electron beam curable type) pressure sensitive adhesives, ultraviolet ray curable pressure sensitive adhesives are preferred. In a case where the pressure sensitive adhesive layer 12 is constituted by using the ultraviolet ray curable type adhesives, a material capable of transmitting an ultraviolet ray is used in the rigid substrate 1 and the vibration relaxation layer 2. As for the water swellable pressure sensitive adhesives, for example, those as disclosed in JP-B Nos. 5-77284 and 6-101455 are preferably used.

The energy ray curable type pressure sensitive adhesive ordinarily comprises an acrylic pressure sensitive adhesive and an energy ray polymerizable compound as main components. Details of these energy ray curable type pressure sensitive adhesives are described in, for example, JP-A Nos. 60-196956, 60-223139, 5-32946 and 8-27239.

Such energy ray curable type pressure sensitive adhesive as described above has a sufficient adhesive strength to the wafer prior to energy ray irradiation and remarkably reduces the adhesive strength to the wafer after the energy ray irradiation. Namely, prior to the energy ray irradiation, the pressure sensitive adhesive sheet and the wafer are allowed to be in a close contact with each other, to thereby enable to protect the surface thereof, while, after the energy ray irradiation, the pressure sensitive adhesive sheet can easily be peeled from a ground wafer.

Thickness of the pressure sensitive adhesive layer 12 is determined depending on conditions such as a configuration, surface state of the wafer to be protected and a polishing method therefor and is, preferably, 10 to 500 µm and, particularly preferably, 20 to 300 µm.

The pressure sensitive adhesive sheet 10 according to the present invention can be obtained by, firstly, applying the pressure sensitive adhesive on the surface of the laminate of the rigid substrate 1 and the vibration relaxation layer 2 at the side of the rigid substrate 1 in an appropriate thickness in accordance with a generally known technique such as that using a roll coater, a knife coater, a gravure coater, a die coater or a reverse coater, secondly, forming the pressure sensitive adhesive layer 12 by drying the thus-applied pressure sensitive adhesive and, then, optionally, applying a releasing sheet to the thus-formed pressure sensitive adhesive layer 12.

Meanwhile, when the pressure sensitive adhesive sheet according to the present invention is used for producing a chip having a large irregularity on a surface thereof (hereinafter, referred to also as "high bump chip") which has recently been increasing in number, the thickness of the pressure sensitive adhesive layer 12 is allowed to be 1.0 to 5 times and, preferably, 1.1 to 3.0 times the bump height. Since the pressure sensitive adhesive layer 12 having the thickness within these ranges can absorb the irregularity while moving along contours of the bumps on the surface of the chip and maintain the chip to be flat, a grinding operation can be performed with a favorable precision. Further, instead of increasing the thickness of the pressure sensitive adhesive layer 12, a buffer layer may be provided between the rigid substrate 1 and the pressure sensitive adhesive layer 12. When the buffer layer is provided, the thickness of the pressure sensitive adhesive layer 12 is, preferably, in the range of from about 5 µm to about 60 µm.

The elastic modulus at 23° C. of the buffer layer is preferably in the range of $5.0\times10^4$ to $1.0\times10^7$ Pa. The tan δ value thereof is preferably 0.3 or more. It is preferred that the thickness of the buffer layer is in the range of about 1.0 to about 5.0 times and, preferably, about 1.1 to about 3.0 times the bump height. So long as the buffer layer has such thickness and characteristics as described above, the buffer layer may be made from any material and, also, may include any one of components used in the pressure sensitive adhesive. Even though the buffer layer may be made from the material selected from same components as those of the pressure sensitive adhesive layer 12, since peelability is not needed, it may be formed by a general-purpose pressure sensitive adhesive.

The pressure sensitive adhesive sheet 10 according to the present invention is characterized in that the pressure sensitive adhesive layer 12 is provided on the surface of the laminate of the rigid substrate 1 and the vibration relaxation layer 2 at the side of the rigid substrate 1. The pressure sensitive adhesive sheet in which the pressure sensitive adhesive layer 12 is provided on the surface of the laminate of the rigid substrate 1 and the vibration relaxation layer 2 at the side of the vibration relaxation layer 2 can not obtain an effect according to the present invention.

The pressure sensitive adhesive sheet 10 according to the present invention is preferably used as a protection of the surface of the wafer and a temporarily fixing device of the wafer, particularly in the method for producing the semiconductor chip by forming grooves of a cut depth smaller than the thickness of the wafer from the wafer surface on which the semiconductor circuit is formed and, then, reducing the thickness of the semiconductor wafer and, also, allowing the wafer to be finally divided into individual chips by grinding the back of the semiconductor wafer.

More specifically, the pressure sensitive adhesive sheet 10 is used in the method for producing the semiconductor wafer having the steps as described below.

Figure 2:
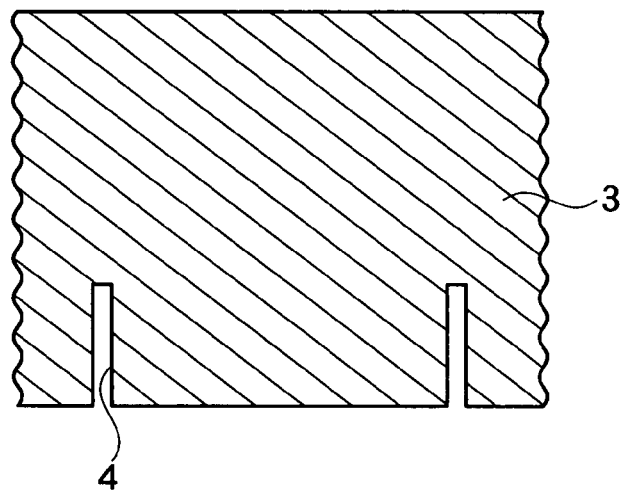
FIG. 2 shows a step for producing a thin type semiconductor chip using a pressure sensitive adhesive sheet according to the present invention.

First step: forming grooves 4 having a given depth along the wafer cutting sites partitioning a plurality of circuits from the surface of wafer 3 (see FIG. 2).

Figure 3:
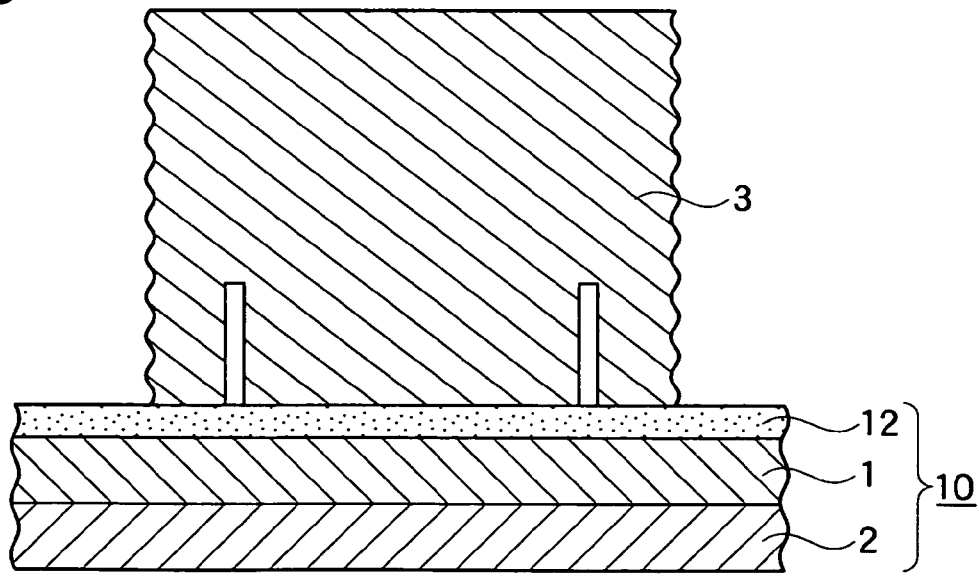
FIG. 3 shows another step for producing a thin type semiconductor chip using a pressure sensitive adhesive sheet according to the present invention.

Second step: sticking the pressure sensitive adhesive sheet 10 according to the present invention such that an entire surface of the wafer 3 is covered (see FIG. 3).

Figure 4:
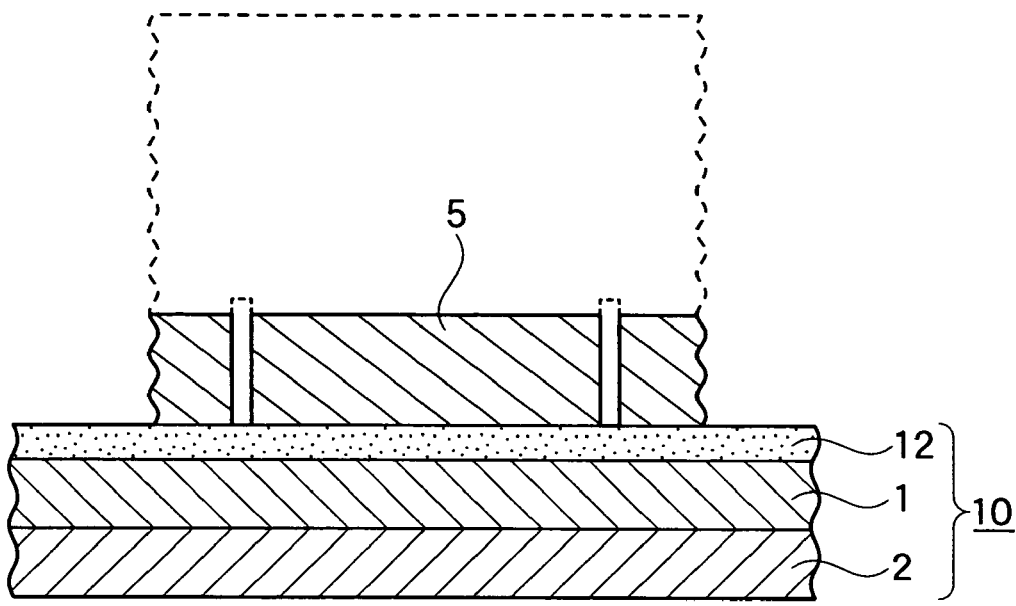
FIG. 4 shows still another step for producing a thin type semiconductor chip using a pressure sensitive adhesive sheet according to the present invention.

Third step: grinding the back of the wafer until the bottom portion of the grooves 4 is removed and the thickness of the wafer reaches a given value, to thereby divide the wafer into individual chips 5 (see FIG. 4).

Figure 5:
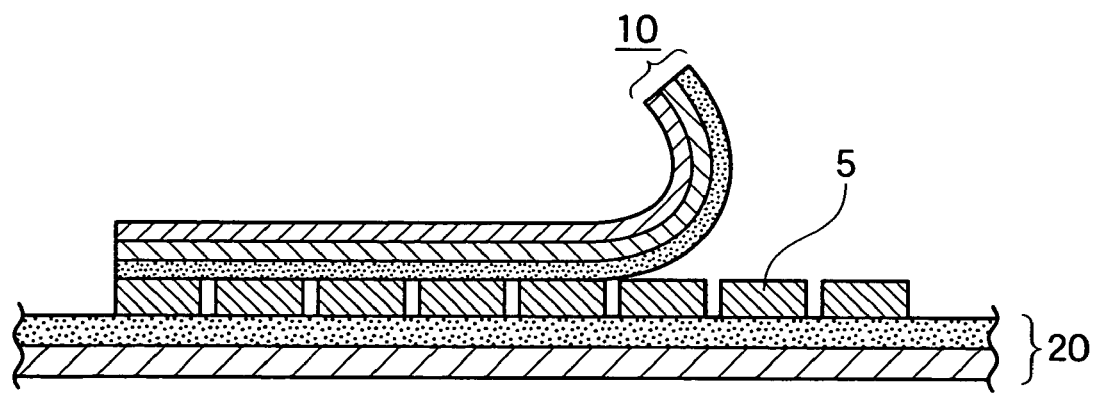
FIG. 5 shows even still another step for producing a thin type semiconductor chip using a pressure sensitive adhesive sheet according to the present invention.

Thereafter, when the pressure sensitive adhesive layer 12 is formed by using the energy ray curable pressure sensitive adhesive, the pressure sensitive adhesive layer 12 is exposed to energy ray irradiation, to thereby reduce the adhesive strength thereof. Another pressure sensitive adhesive sheet 20 (sheet for pickup) is stuck onto a polished face of the chip. The chip position and direction are adjusted so as to enable pickup. The pressure sensitive adhesive sheet 20 is secured onto a ring frame. The pressure sensitive adhesive sheet 10 is peeled off (see FIG. 5). Then, the chip is picked up and mounted on a predetermined position of the base substance.

When such steps as described above are performed by using the pressure sensitive adhesive sheet 10 according to the present invention, the semiconductor chip of thin type can be produced with favorable yield.

According to the present invention, the pressure sensitive adhesive sheet to be used in producing an extremely thin semiconductor chip which is free of breakage and discoloration by a predicing process and a method of use thereof can be provided.

EXAMPLES

The present invention will further be illustrated below with reference to the following Examples which in no way limit the scope of the invention.

In the following Examples and Comparative Examples, measurements of "Young's modulus" and "tan δ value" of each component of the pressure sensitive adhesive sheet, a measurement of "elastic modulus of pressure sensitive adhesive layer", evaluations of "back face grinding test" of the wafer performed by using each pressure sensitive adhesive sheet, "chip corner breakage", "ratio of reduction of calf interval", "transferability" and "discoloration of ground face" of the semiconductor chips thus obtained were performed in respective manners as described below.

"Young's Modulus"

The Young's modulus was measured at a test speed of 200 mm/min in accordance with Japanese Industrial Standard (JIS) K-7127.

"Tan δ Value"

The tan δ value was measured at a 11 Hz tensile stress by means of dynamic viscoelasticity measuring instrument.

Specifically, each substrate was sampled into a given size, and tan δ thereof at a temperature in the range of −20 to 150° C. was measured at a frequency of 11 Hz by using Rheovibron DDV-II-EP manufactured by Orientec Co., LTD. A maximum value at a temperature in the range of −5 to 120° C. was adopted as the tan δ value.

"Elastic Modulus of Pressure Sensitive Adhesive Layer"

A sample having sizes of 8 mm diameter×3 mm was punched out of a dried pressure sensitive adhesive. By using a viscoelasticity measuring instrument (trade name: Dynamic Analyzer RDA II; manufactured by Rheometrics, Inc.), elastic modulus G' of the sample was measured at 1 Hz in an atmosphere of 23° C. in accordance with a torsion shear method.

"Back Face Grinding Test"

By using a dicing apparatus (trade name: DFD 641; manufactured by Disco Corporation), cut grooves (in half-cuts) were formed on an 8-inch mirror wafer from a mirror face side under the following conditions:
chip size: 10 mm×10 mm;
width: 35 μm; and
depth: 70 μm Thereafter, each pressure sensitive adhesive sheet of Examples or Comparative Examples was stuck onto the half-cut mirror wafer by using a laminator (trade name: RAD-3500 m/12; manufactured by Lintec Corporation). Subsequently, by using a wafer back face grinding apparatus (trade name: DFG-8540; manufactured by Disco Corporation), the wafer was ground from a back face onto which the pressure sensitive adhesive sheet was not stuck such that it came to have a thickness of 50 μm and was finally divided to individual chips. The resultant chips were subjected to evaluations.

"Chip Corner Breakage"

After the back face grinding was performed, corner portions of 240 pieces of chips (each in sizes: 10 mm×10 mm; thickness: 50 μm) thus divided on the pressure sensitive adhesive sheet were each observed through a 30-times optical microscope from a ground face side. The number of the chips each having a broken corner was counted.

"Ratio of Reduction of Calf Interval"

After a half cut dicing was performed by a 10 mm×10 mm chip size on an 8-inch mirror wafer from a mirror face side by using a dicing apparatus (trade name: DFD 641; manufactured by Disco Corporation), width of the resultant cut groove (calf) was measured (a value obtained on this occasion is represented by "A"). A pressure sensitive adhesive sheet was stuck onto a mirror face of the wafer which was subjected to the half cut dicing by using a laminator (trade name: RAD-3500 m/12; manufactured by Lintec Corporation). Subsequently, by using a wafer back face grinding apparatus (trade name: DFG-8540; manufactured by Disco Corporation), the wafer was ground from a back face onto which the pressure sensitive adhesive sheet was not stuck such that it came to have a thickness of 50 μm and was finally divided to individual chips. Then, an interval between chips thus divided was measured (a value obtained on this occasion is represented by "B"). The ratio of reduction of calf interval is represented by the formula (A−B)/A×100. When a value obtained by the above formula was 10% or more, the result was defined as "defective".

"Transferability"

In a case where the pressure sensitive adhesive layer of the pressure sensitive adhesive sheet stuck onto the chips thus divided was of an ultraviolet ray (hereinafter, referred to also as "UV" for short) curable type, UV irradiation (illuminance: 150 mW/cm$^2$; light intensity: 300 mJ/cm$^2$) was performed from a side of the pressure sensitive adhesive sheet (in a case where the pressure sensitive adhesive layer is not of a UV curable type, UV was not irradiated) and, then, an adhesive sheet (trade name: D-628; dicing sheet manufactured by Lintec Corporation) for pickup was stuck onto a back face (grounded face) of the chips together with a ring frame and, thereafter, the pressure sensitive adhesive sheet previously stuck onto the chips was peeled off. On this occasion, when all of the chips thus divided were transferred to the sheet for pickup, such transfer was evaluated as being "good", while, when all of the chips thus divided were not always transferred to the sheet for pickup, the transfer was evaluated as being "poor".

"Discoloration of Ground Face"

After the back face of the chip was ground, presence or absence of discoloration was visually confirmed.

Example 1

Rigid substrate: polyethylene terephthalate (PET) film having a thickness of 25 μm.

Vibration relaxation layer: a composition including 60 parts by weight of bifunctional urethane acrylate type oligomer having a weight average molecular weight of 8100 (trade name: UX-3301; manufactured by Nippon Kayaku Co., Ltd.), 40 parts by weight of dicyclopentanyl acrylate, 4.0 parts by weight of 1-hydroxycyclohexyl phenyl ketone (trade name: IRGACURE™ 184; Ciba Specialty Chemicals) as a phtopolymerization initiator was applied on one face of the rigid substrate such that it had a thickness of 45 μm after UV cured and, then, cured by a UV irradiation, to thereby form a vibration relaxation layer.

Pressure sensitive adhesive layer: a pressure sensitive adhesive composition comprising 100 parts by weight of acrylic pressure sensitive adhesive (copolymer of 85 parts by weight of butyl acrylate, 9 parts by weight of methyl methacrylate, 5 parts by weight of hydroxyethyl acrylate and 1 part by weight of acrylic acid) and 2 parts by weight of an adduct of tolylene diisocyanate and trimethylol propane as a curing agent were mixed with each other.

Pressure Sensitive Adhesive Sheet:

The pressure sensitive adhesive composition was applied on a face of a laminate of the rigid substrate and the vibration relaxation layer at the side of the rigid substrate such that thickness thereof was 40 μm (elastic modulus at 23° C.: $1.0 \times 10^5$ Pa) and, then, dried, to thereby prepare a pressure sensitive adhesive sheet. The thus-prepared pressure sensitive adhesive sheet was applied on a half-cut mirror face of the wafer and, then, subjected to the back face grinding test. The results are shown in Table 1.

Example 2

A pressure sensitive adhesive sheet was prepared in a same manner as in Example 1 except that, in the pressure sensitive adhesive layer, the composition was changed into that including 100 parts by weight of acrylic pressure sensitive adhesive (copolymer (weight average molecular weight: 600000) of 90 parts by weight of n-butyl acrylate and 10 parts by weight of acrylic acid), 120 parts by weight of urethane acrylate type oligomer having a weight average molecular weight of 5000, 2.0 parts by weight of a photopolymerization initiator (trade name: IRGACURE™ 184; manufactured by Ciba Specialty Chemicals) and 2 parts by weight of an adduct of tolylene diisocyanate and trimethylol propane as a curing agent and, also, the thickness of thereof after cured was changed into 200 μm (elastic modulus at 23° C. prior to energy ray curing: $1.5 \times 10^5$ Pa). The thus-obtained pressure sensitive adhesive sheet was applied on a half-cut mirror face of the wafer and, then, subjected to the back face grinding test. The results are shown in Table 1.

Example 3

A pressure sensitive adhesive sheet was prepared in a same manner as in Example 1 except that the rigid substrate was changed into a polyethylene terephthalate film having a thickness of 125 μm. The thus-obtained pressure sensitive adhesive sheet was applied on a half-cut mirror face of the wafer and, then, subjected to the back face grinding test. The results are shown in Table 1.

Example 4

A pressure sensitive adhesive sheet was prepared in a same manner as in Example 1 except that the thickness of the vibration relaxation layer was changed into 75 μm. The thus-obtained pressure sensitive adhesive sheet was applied on a half-cut mirror face of the wafer and, then, subjected to the back face grinding test. The results are shown in Table 1.

Example 5

A pressure sensitive adhesive sheet was prepared in a same manner as in Example 1 except that the rigid substrate and the vibration relaxation layer were changed as described below. The thus-obtained pressure sensitive adhesive sheet was applied on a half-cut mirror face of the wafer and, then, subjected to the backface grinding test. The results are shown in Table 1.

Rigid substrate: same as in Example 1.

Vibration relaxation layer: a composition including 50 parts by weight of bifunctional urethane acrylate type oligomer having a weight average molecular weight of 5000 (manufactured by Dainichiseika Color & Chemicals MFG. Co., Ltd.), 50 parts by weight of isobornyl acrylate and 2.0 parts by weight of 2-hydroxy-2-methyl-1-phenyl-propane-1-one (trade name: DAROCURE™ 1173; manufactured by Ciba Specialty Chemicals) as a photopolymerization initiator was applied on one face of the rigid substrate such that thickness thereof after cured was 45 μm and, then, cured by UV irradiation, to thereby prepare a laminate, of the rigid substrate and the vibration relaxation layer, having a thickness of 70 μm.

Example 6

A pressure sensitive adhesive sheet was prepared in a same manner as in Example 1 except that the rigid substrate was changed into a biaxially oriented polypropylene film (OPP) having a thickness of 100 μm. The thus-obtained pressure sensitive adhesive sheet was applied on a half-cut mirror face of the wafer and, then, subjected to the back face grinding test. The results are shown in Table 1.

Example 7

A pressure sensitive adhesive sheet was prepared in a same manner as in Example 1 except that the rigid substrate was changed into a polyethylene naphthalate film (PEN) having a thickness of 25 μm. The thus-obtained pressure sensitive adhesive sheet was applied on a half-cut mirror face of the wafer and, then, subjected to the back face grinding test. The results are shown in Table 1.

Example 8

A pressure sensitive adhesive sheet was prepared in a same manner as in Example 1 except that the rigid substrate was changed into a polyimide film (PI) having a thickness of 25 μm. The thus-obtained pressure sensitive adhesive sheet was applied on a half-cut mirror face of the wafer and, then, subjected to the backface grinding test. The results are shown in Table 1.

Comparative Example 1

A pressure sensitive adhesive sheet was prepared in a same manner as in Example 1 except that the rigid substrate was not laminated with the vibration relaxation layer. The thus-obtained pressure sensitive adhesive sheet was applied on a half-cut mirror face of the wafer and, then, subjected to the back face grinding test. The results are shown in Table 1.

Comparative Example 2

A pressure sensitive adhesive sheet was prepared in a same manner as in Example 1 except that the rigid substrate was changed into a non-stretched polypropylene film (CPP) having a thickness of 100 μm. The thus-obtained pressure sensitive adhesive sheet was applied on a half-cut mirror face of the wafer and, then, subjected to the back face grinding test. The results are shown in Table 1.

Comparative Example 3

Rigid substrate: same as in Example 1.

A low-density polyethylene film having a thickness of 50 μm was stuck in place of the vibration relaxation layer onto the rigid substrate by using a polyester type adhesive for dry laminate, to thereby prepare a laminate having a thickness of 80 μm.

Pressure sensitive adhesive layer: same pressure sensitive adhesive as in Example 1.

Pressure sensitive adhesive sheet: the pressure sensitive adhesive was applied on a face of the laminate at the side of the rigid substrate such that the thickness of the pressure sensitive adhesive layer was 40 μm and, then, dried, to thereby prepare a pressure sensitive adhesive sheet. The thus-obtained pressure sensitive adhesive sheet was applied on a half-cut mirror face of the wafer and, then, subjected to the back face grinding test. The results are shown in Table 1.

Comparative Example 4

Rigid substrate: same as in Example 1.

An ethylene-methyl methacrylate copolymer (content of methyl methacrylate: 6% by weight) film having a thickness of 50 μm was stuck in place of the vibration relaxation layer onto the rigid substrate by using a polyester type adhesive for dry laminate, to thereby prepare a laminate having a thickness of 80 μm.

Pressure sensitive adhesive layer: same pressure sensitive adhesive as in Example 1.

Pressure sensitive adhesive sheet: the pressure sensitive adhesive was applied on a face of the laminate at the side of the rigid substrate such that the thickness of the pressure sensitive adhesive layer was 40 μm and, then, dried, to thereby prepare a pressure sensitive adhesive sheet. The thus-obtained pressure sensitive adhesive sheet was applied on a half-cut mirror face of the wafer and, then, subjected to the back face grinding test. The results are shown in Table 1.

Comparative Example 5

A pressure sensitive adhesive sheet was obtained in a same manner as in Example 1 except that the thickness of the vibration relaxation layer was changed into 110 μm. The thus-obtained pressure sensitive adhesive sheet was applied on a half-cut mirror face of the wafer and, then, subjected to the back face grinding test. The results are shown in Table 1.

Comparative Example 6

A pressure sensitive adhesive sheet was prepared in a same manner as in Example 1 except that the rigid substrate was changed into a polyethylene terephthalate film having a thickness of 188 μm. The thus-obtained pressure sensitive adhesive sheet was applied on a half-cut mirror face of the wafer and, then, subjected to the back face grinding test. The results are shown in Table 1.

Comparative Example 7

A pressure sensitive adhesive sheet was prepared in a same manner as in Example 1 except that the pressure sensitive adhesive was applied on a face of the laminate at the side of the vibration relaxation layer. The thus-obtained pressure sensitive adhesive sheet was applied on a half-cut mirror face of the wafer and, then, subjected to the back face grinding test. The results are shown in Table 1.

What is claimed is:

1. A pressure sensitive adhesive sheet, being used in a method for producing a semiconductor chip, wherein the method comprises the steps of:
    forming a groove having depth smaller than thickness of a wafer on a surface of the wafer on which a semiconductor circuit is formed; reducing the thickness of the wafer and finally dividing the wafer into individual chips by grinding a back face of the wafer;
    the pressure sensitive adhesive sheet, comprising a rigid substrate, a vibration relaxation layer provided on one face of the rigid substrate and a pressure sensitive adhesive layer provided on the other face of the rigid substrate,
    wherein thickness of the rigid substrate is 10 to 150 μm and Young's modulus thereof is 1000 to 30000 MPa; and
    thickness of the vibration relaxation layer is 5 to 80 μm and a peak value of tan δ of dynamic viscoelasticity thereof at −5° C. to 120° C. is 0.5 or more.

2. The pressure sensitive adhesive sheet according to claim 1, which is used for producing a semiconductor chip having a thickness of 100 μm or less.

3. A method for producing a semiconductor chip, comprising the steps of:
    forming a groove having depth smaller than thickness of a wafer on a surface of the wafer on which a semiconductor circuit is formed;
    sticking a pressure sensitive adhesive sheet, comprising a rigid substrate, a vibration relaxation layer provided on one face of the rigid substrate and a pressure sensitive adhesive layer provided on the other face of the rigid substrate, wherein thickness of the rigid substrate is 10 to 150 μm and Young's modulus thereof is 1000 to 30000 MPa; and thickness of the vibration relaxation layer is 5 to 80 μm and a peak value of tan δ of dynamic viscoelasticity thereof at −5° C. to 120° C. is 0.5 or more on to the surface on which the circuit is formed; and Table 1

| | Rigid substrate | | | Vibration relaxation layer | | Pressure sensitive adhesive layer | Result | | | |
|---|---|---|---|---|---|---|---|---|---|---|
| | Material | Thickness (μm) | Young's modulus (MPa) | Thickness (μm) | tan δ value | Thickness (μm) | Chip corner breakage (No. of broken chips/No. of total chips) | Ratio of reduction of calf interval (%) | Transfer-ability | Discoloration of ground face |
| Example 1 | PET | 25 | 4000 | 45 | 0.6 | 40 | 0/240 | 7 | Good | Absent |
| 2 | PET | 25 | 4000 | 45 | 0.6 | 200 | 0/240 | 7 | Good | Absent |
| 3 | PET | 125 | 4000 | 45 | 0.6 | 40 | 0/240 | 2 | Good | Absent |
| 4 | PET | 25 | 4000 | 75 | 0.6 | 40 | 0/240 | 7 | Good | Absent |
| 5 | PET | 25 | 4000 | 45 | 0.53 | 40 | 0/240 | 7 | Good | Absent |
| 6 | OPP | 100 | 1600 | 45 | 0.6 | 40 | 0/240 | 4 | Good | Absent |
| 7 | PEN | 25 | 6000 | 45 | 0.6 | 40 | 0/240 | 5 | Good | Absent |
| 8 | PI | 25 | 9000 | 45 | 0.6 | 40 | 0/240 | 3 | Good | Absent |
| Comp. Ex. 1 | PET | 25 | 4000 | — | — | 40 | 240/240 | 7 | Good | Absent |
| 2 | CPP | 100 | 600 | 45 | 0.6 | 40 | 0/240 | 30 | Good | Absent |
| 3 | PET | 25 | 4000 | 50 | 0.17 | 40 | 50/240 | 7 | Good | Absent |
| 4 | PET | 25 | 4000 | 50 | 0.21 | 40 | 24/240 | 7 | Good | Absent |
| 5 | PET | 25 | 4000 | 110 | 0.6 | 40 | 12/240 | 7 | Good | Absent |
| 6 | PET | 188 | 4000 | 45 | 0.6 | 40 | 0/240 | 2 | poor | Absent |
| 7 | PET | 25 | 4000 | 45 | 0.6 | 40 | 0/240 | 8 | Good | Present | reducing the thickness of the wafer and finally dividing the wafer into individual chips by grinding a back face of the wafer.

4. The method for producing the semiconductor chip according to claim 3, wherein the resulting semiconductor chip has a thickness of 100 µm or less.

5. The pressure sensitive adhesive sheet according to claim 1, wherein the vibration relaxation layer is obtained by curing a composition including a urethane acrylate type oligomer and a photopolymerizable monomer, selected from isobomyl acrylate, isobomyl methacrylate, dicyclopentenyl acrylate, dicyclopentenyl methacrylate, dicyclopentanyl acrylate, dicyclopentanyl methacrylate, dicyclopentenyloxy acrylate, dicyclopentenyloxy methacrylate, cyclohexyl acrylate, cyclohexyl methacrylate, adamantine acrylate, adamantine methacrylate, benzyl acrylate, tetrahydrofurfuryl acrylate, tetrahydrofurfuryl methacrylate, morpholinyl acrylate, N-vinylpyrrolidone and N-vinylcaprolactam.

6. The pressure sensitive adhesive sheet according to claim 2, wherein the vibration relaxation layer is obtained by curing a composition including a urethane acrylate type oligomer and a photopolymerizable monomer, selected from isobomyl acrylate, isobomyl methacrylate, dicyclopentenyl acrylate, dicyclopentenyl methacrylate, dicyclopentanyl acrylate, dicyclopentanyl methacrylate, dicyclopentenyloxy acrylate, dicyclopentenyloxy methacrylate, cyclohexyl acrylate, cyclohexyl methacrylate, adamantine acrylate, adamantine methacrylate, benzyl acrylate, tetrahydrofurfuryl acrylate, tetrahydrofurfuryl methacrylate, morpholinyl acrylate, N-vinylpyrrolidone and N-vinylcaprolactam.

* * * * *

UNITED STATES PATENT AND TRADEMARK OFFICE
CERTIFICATE OF CORRECTION

PATENT NO.          : 7,351,645 B2
APPLICATION NO. : 11/140763
DATED                   : April 1, 2008
INVENTOR(S)         : Ohashi et al.

Page 1 of 1

It is certified that error appears in the above-identified patent and that said Letters Patent is hereby corrected as shown below:

Column 15, Claim 5, line 11, "isobomyl acrylate, isobomyl methacrylate" should read -- isobornyl acrylate, isobornyl methacrylate --

Column 16, Claim 6, line 7, "isobomyl acrylate, isobomyl methacrylate" should read -- isobornyl acrylate, isobornyl methacrylate --

Signed and Sealed this

Sixteenth Day of September, 2008

JON W. DUDAS
*Director of the United States Patent and Trademark Office*